(12) United States Patent
Evers et al.

(10) Patent No.: US 6,873,200 B2
(45) Date of Patent: Mar. 29, 2005

(54) ELECTRONIC SWITCH

(75) Inventors: Christian Evers, Kirchheim (DE); Wolfgang Cohrs, Poing (DE); Wolfgang Richter, Haar (DE); Thomas Will, Pfaffenhofen (DE); Martin Hassler, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 10/633,174

(22) Filed: Aug. 1, 2003

(65) Prior Publication Data

US 2005/0024122 A1 Feb. 3, 2005

(51) Int. Cl.[7] .............................................. H03K 17/00
(52) U.S. Cl. ...................... 327/365; 327/362; 327/378; 333/81 R
(58) Field of Search ................................ 327/362, 365, 327/378, 431, 435; 333/81 R, 262

(56) References Cited

U.S. PATENT DOCUMENTS 4,511,814 A * 4/1985 Matsuo et al. .............. 327/391
5,338,977 A 8/1994 Carobolante
2002/0067205 A1 6/2002 Aparin et al.

* cited by examiner

Primary Examiner—Kenneth B. Wells
(74) Attorney, Agent, or Firm—Caesar, Rivise, Bernstein, Cohen & Pokotilow, Ltd.

(57) ABSTRACT

Electronic switch (1) with two switching states (ON, OFF) possesses at least one field effect switching transistor (Q1), input port (In) connected with source terminal (S), on which input signal (Vin) is present, output port (Out) connected with drain terminal, on which switched signal (Vout) is present, control port (Con) connected to gate terminal (G), on which is present signal (Vc) for controlling electronic switch (1) and switch apparatus (Sw), which creates the two switching states (ON, OFF) by means of a changing of control signal (Vc). Controlling signal (Vc), during at least one of the two switching states (ON, OFF) is, at least partially, formed by correction signal (Sc), which in turn is produced from input signal (Vin), so that the frequency dependent drop in voltage between the drain-source channel and the gate electrode of the field effect switching transistor (Q1) is at least partially compensated.

25 Claims, 4 Drawing Sheets

ELECTRONIC SWITCH

BACKGROUND OF THE INVENTION

The invention concerns an electronic switch with a field effect transistor (FET). The electronic switch serves for rapid switching of broadband, high frequency signals of high amplitude dynamics.

Electronic switches, for example, are employed in high frequency technology in signal attenuators with switchable attenuation stages. To this purpose, mostly FETs are used, connected in series, or for very high frequency and broadband applications, metal, semiconductor field effect transistors (MESFET) are employed. The bandwidths run, for example, from 1 GHz up to several multiples of 10 GHz. Usually, n-channel-MESFET on a gallium arsenide basis is chosen.

Such an electronic switch, for example, is made known by U.S. Pat. No. 5,107,152. The circuit disclosed in that patent, with the aid of a diode connected in series with a control port, attempts to improve the low frequency, large signal behavior of the switch, which is governed essentially by the voltage drop over the capacitive portion of the Source-Gate-region and the Drain-Gate-region, respectively.

The disadvantage found in the electronic switch as taught by U.S. Pat. No. 5,107,152 lies therein, in that because of the diodes, the switching time of the electronic switch is essentially increased. In addition to this, the diode improves only one of the two states of the electronic switch.

For the improvement of the low frequency, large signal behavior, further measures can be considered. For example, the gate series resistance can be increased, whereby, however, the switching time would clearly be longer. Finally, the pinch-off voltage of the FETs can be increased by modification of the manufacture process, whereby, especially in the case of MESFETs, narrow limits are imposed by the limited voltage sustaining capability of metal-semiconductor junctions when operated in reverse direction.

On this account it is the purpose of the invention to disclose an electronic switch, which, independently from the characteristics of the input signal, assumes the desired switching state quickly and reliably and holds itself in the chosen state.

SUMMARY OF THE INVENTION

In accord with the invention, the signal to be switched, ahead of the electronic switch is non-reactively coupled out, and superimposed onto the control signal in at least one of the two possible switching states.

Because of the formation of the control signal in a conversion device with a voltage gain, which preferably is unity, i.e., 1, the influence of the input signal on the controlling signal can be caused to conform particularly well to the characteristics of the components employed in the electronic switch.

Because of the implementation of the conversion device with a high input impedance and a low output impedance, it becomes possible to allow the input signal to be coupled out without reactive effects.

The conversion device can be constructed with FETs. This can also be carried out particularly advantageously with n-channel-MESFETs.

If the switching apparatus, which brings about the two switching states, is made with FET or n-MESFET on a basis of silicon or gallium arsenide on a semiconductor chip, then it is possible that the electronic switch, with its switch apparatus, can be constructed with especial simplicity. Added to this advantage, is the fact that especially low switching times, i.e., reaction times, are achieved and the switch apparatus can be integrated together with other components of the electronic switch on a semiconductor chip.

Advantageously, the two switching states can be brought about, in which, allowed by the switching apparatus, either a first DC voltage or the correction signal is applied to the control terminal. The correction signal acts, in this respect, only in one of the two possible switching states. Furthermore, it is to advantage, to create the ON-state by the connection of the control port with the correction signal and to choose the first DC voltage to be less, that is more negative, than the pinch-off voltage of the first field effect switching transistor.

However it is considered favorable, if in both switch states, the correction signal acts upon the control port and for the bringing about of the two switch states, the correction signal is superimposed by a first or a second DC voltage.

In this manner, then both in the ON-state as well as in the OFF-state, an improvement of the low frequency large signal behavior of the electronic switch is achieved. Especially advantageous is again the choice of holding the first DC potential at a lower level, i.e., more negative, than the pinch-off voltage of the field effect switch transistor, and the second voltage is made as high as the reference potential. In this way, in an advantageous manner, the ON-state is made by adding the second DC voltage and the OFF-state is achieved by adding the first DC voltage to the correction signal, which is continuously connected to the control port.

BRIEF DESCRIPTION OF SEVERAL VIEWS OF THE DRAWINGS

The state of the technology and embodiments of the invention —simplified for clarity —follow and are more closely described with the aid of the drawings. In the figures, agreeing components are provided with agreeing reference numbers. The FETs in the examples are all self conducting, n-channel metal, semiconductor field effect transistors (n-MESFET) constructed on a gallium arsenide basis. It is also possible that the embodiments could be carried out with n-MESFETs of other types and other types of semiconductor material. There is shown in the drawings.

DETAILED DESCRIPTION OF THE INVENTION

Figure 1:
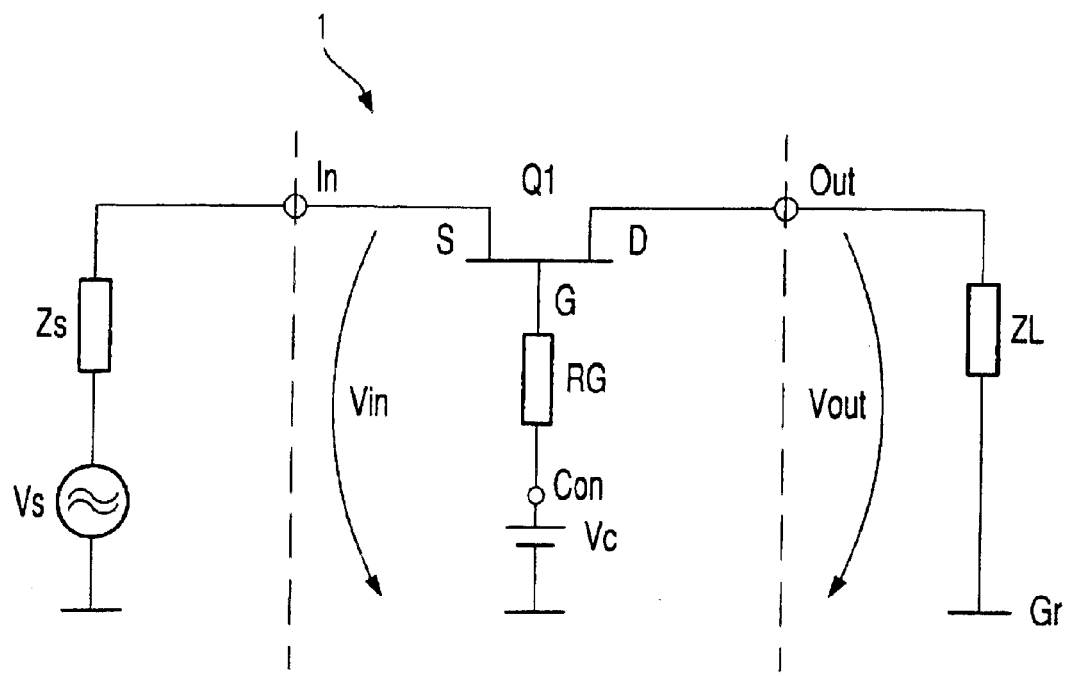
FIG. 1 an electronic switch with a field effect switch transistor in accord with the state of the technology, FIG. 2 the AC equivalent circuit diagram of an electronic switch with a field effect switch transistor, FIG. 3 the principal circuit diagram of a first embodiment of an invented electronic switch with a field effect switch transistor, FIG. 4 the principal circuit diagram of a second embodiment of an invented electronic switch with a field effect switch transistor, FIG. 5 a schematic circuit of a realization of the first embodiment as depicted in FIG. 3, FIG. 6 a schematic circuit of a realization of the second embodiment as depicted in FIG. 4, and FIG. 7 a schematic circuit of a realization of the invented electronic switch with an operational amplifier.

FIG. 1 shows an electronic switch 1 with an FET Q1 in accordance with the state of the technology. The FET Q1 has a gate terminal G connected to a control port Con through a first resistance RG. Also depicted is a source terminal S connected to an input In and a drain terminal D connected to an output Out. A control signal Vc applied to the control port Con, whose value in this embodiment can assume two different DC voltages, controls the switching state of the electronic switch 1.

The value of the DC voltage is, for example, altered by a switching apparatus not shown in FIG. 1. Usually one of the two DC values is equal to 0 V, with reference to a common reference potential Gr. With self conducting, n-channel metal semiconductor field-effect transistors, preferred in microwave technology, this value of DC voltage establishes the ON-state. In the ON-state, the FET Q1 switches an input signal Vin, which is present at the input port In directly through to the output port Out. The input signal Vin, in this case, then appears at the output port Out as the switched signal Vout. The OFF-state is obtained by applying a DC voltage to the control port Con, whose value must be less than that of the inherent pinch-off voltage of the FET Q1. In the embodiment shown, the voltage Vc for the OFF-state is less than —that is to say, more negative —than the pinch-off voltage. Due to the voltage sustaining capability of the metal-semiconductor junctions being limited, the voltage Vc for the OFF-state may fall below the pinch-off voltage by only a relatively small amount.

The input port IN of the electronic switch in FIG. 1 is connected through a resistance Zs with a signal source Vs. The output port Out is connected through a load resistance ZL to the common reference potential Gr.

Figure 2:
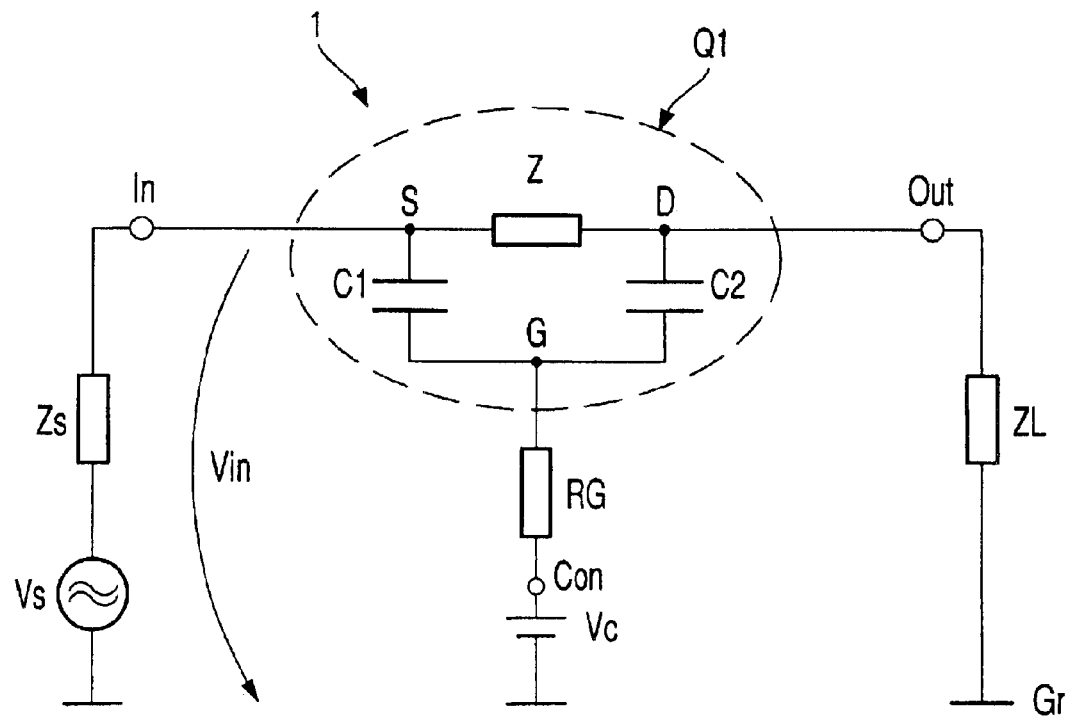

FIG. 2 presents an AC equivalent circuit diagram of an electronic switch 1, based on that of FIG. 1. A first and a second capacitor C1, C2 represent the capacitance existing between the drain-source channel and the gate terminal G. The resistance Z represents the resistance of the drain-source channel between the source terminal S and the drain terminal D. The resistance RG connected to the gate terminal G forms, together with the capacitors C1, C2 a frequency-dependent voltage divider for the input signal Vin present at the source terminal S.

The manner of function is as follows:

In the ON-state, the control signal Vc be equal to zero volts. The FET Q1 is normally closed, i.e., the equivalent channel resistance Z assumes a low value. At a low frequency and corresponding polarity and amplitude of the momentary value of the input signal Vin, the negative voltage drop across the capacitors C1, C2 will be so large in magnitude, that it will become greater than the pinch-off voltage of the FET Q1. The FET Q1 so changes, just because of the signal characteristics of the input signal Vin, into the OFF-state. On the other hand in the OFF-state, the voltage drop across the capacitors C1, C2 can compensate the control signal Vc, which is present at the control port Con, to the extent, that the electronic switch 1 changes into the ON-state. Both effects are undesirable and lead to, first, that the input signal Vin is not completely transmitted (clipping) or second, in the OFF-state, unwanted signal transmission occurs.

Figure 3:
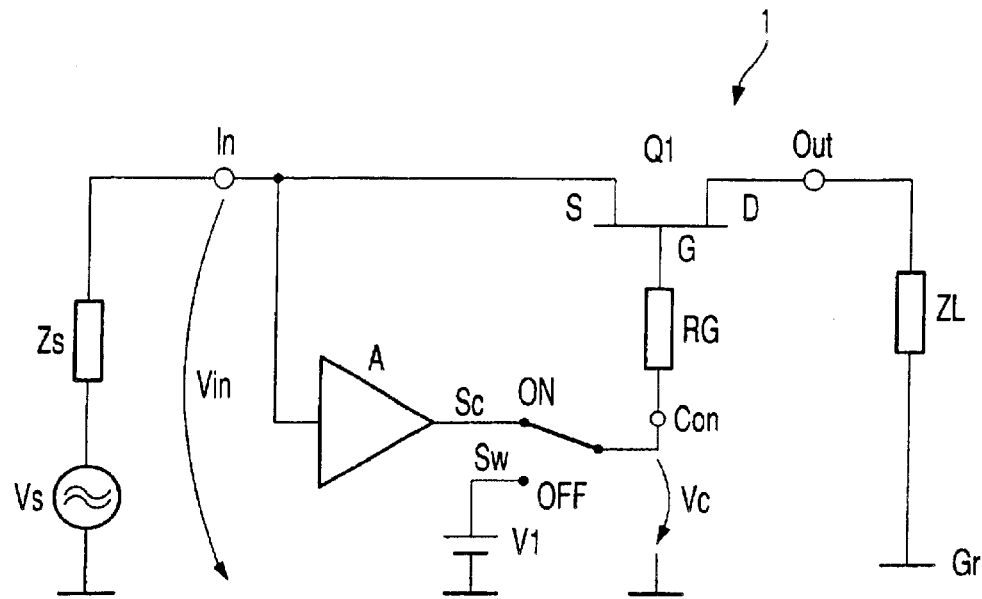

FIG. 3 shows the principal circuit diagram of a first embodiment of an invented electronic switch 1 where a FET Q1 is present. The FET Q1, in this embodiment, is designed as an normally closed n-MESFET on a gallium arsenide basis. The source terminal S and the drain terminal D are connected as in FIG. 1. Between the input IN and the source terminal S the input signal Vin is coupled out and applied to a converter device A. The converter device A possesses a small output impedance and a large input impedance, as a result of which the input signal Vin is non-reactively coupled from the input port. The converter device A in this embodiment has a voltage gain v of about unity and produces a correction signal Sc, which is connected to the switching apparatus Sw. In this embodiment, a first, negative DC voltage V1, the value of which is, for example, -6 volts, is likewise connected to the switch apparatus Sw. Furthermore, the switch apparatus Sw is connected to the control terminal Con, which in turn, and through the resistance RG, is connected to the gate terminal G.

The ON-state is obtained, in that the switch apparatus Sw applies (i.e. switches) the correction signal Sc to the control port Con. The OFF-state is activated by switching the first DC voltage V1 onto the control port Con.

The switch apparatus Sw is designed in the form of a 2-way switch, which respectively, applies either only the correction signal Sc or the first DC voltage V1 to the control port Con.

Due to the correction signal Sc being present at the control port Con during the ON-state, no potential difference can exist between the gate terminal G and the source terminal S. When this occurs, the ON-state is reliably held. The bandwidth of the converter A must be designed only for that range of frequencies in which the admittance of the capacitances C1, C2 as shown in FIG. 2 is small, compared to the conductance value of RG. The switch apparatus Sw can be easily made electronically. The converter A, likewise, can be constructed using n-MESFETs.

Figure 4:
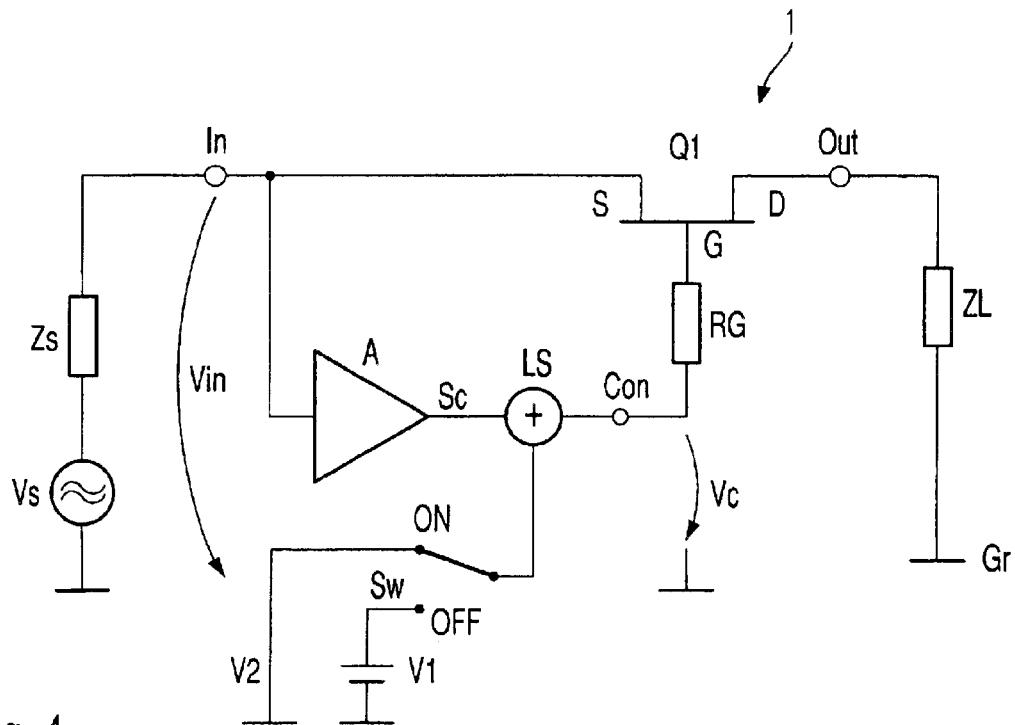

FIG. 4 presents a second invented embodiment, similar to the embodiment example of FIG. 3. Differing from that shown in FIG. 3, between the converter A and the control port Con, a signal adder LS is inserted and connected to the switch apparatus Sw. The switch apparatus Sw is further connected to a second DC voltage V2 and also to the first DC voltage V1. The second DC voltage V2 carries, in this embodiment, zero volts, which is obtained with a direct connection to the reference potential Gr. When in the ON-state condition, the switch apparatus Sw connects the reference potential Gr with the signal adder LS. When in the condition of OFF-state, the negative voltage V1, in this embodiment, is input to the signal adder LS. In the ON-state, immediately, the second DC voltage V2 and in the OFF-state the first DC voltage V1 adds to the correction signal Sc and is applied to the control port Con. For the ON-state, the correction voltage Sc is equal to the input signal Vin. For the OFF-state, the voltage of the control signal Vc represents the first DC voltage V1 which has been added to the correction signal Sc. In this case, the first DC voltage V1 in this embodiment is less than —that is "more negative"—than the pinch-off voltage of the FET Q1. By means of the electronic switch 1 shown in FIG. 4, thus an improvement of the operational behavior in both the ON-state and the OFF-state has been achieved.

Figure 5:
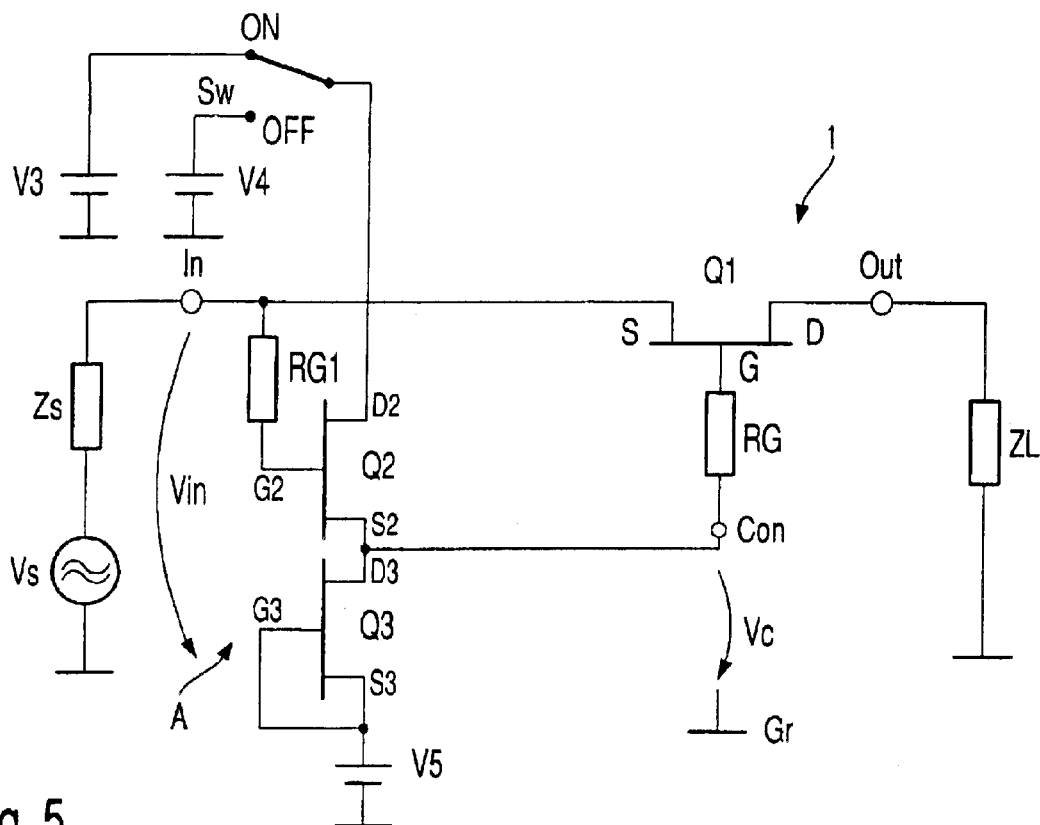

FIG. 5 shows a schematic circuit of a realization of the first embodiment depicted in FIG. 3, wherein the control port Con is connected to the source terminal S2 of a second FET Q2 and connected to the drain terminal D3 of a third FET Q3. The gate terminal G3 and the source terminal S3 of the third FET Q3 are both connected to a common fifth DC voltage V5, which in this embodiment is less than, that is to say, is more negative, than is the reference potential Gr. The gate terminal G2 of the second FET Q2 is connected to the input IN and the source terminal S of the first FET Q1 through a series resistance RG1, which serves to moderate the current over the Schottky contact between the gate terminal G2 and the drain terminal D2 of the second FET Q2. Said resistance is dimensioned, for example, some 10 kOhm. In this embodiment and by means of the switch apparatus Sw, the drain terminal D2 of the second FET Q2 can be optionally connected to either the third DC voltage V3, which is positive with respect to the reference potential Gr or to the negative fourth DC voltage V4. The other circuitry at the input In and the output Out, as well as at the terminals S, G and D for respectively the source, gate and drain terminals of the first FET Q1 is the same as in the previous examples. The second and third FETs Q2, Q3 exhibit in this case, the same electrical characteristics. For an integration, the second and third FETs Q2, Q3 can be selected to be very small in their geometric dimensioning relative to the FET Q1, for instance, only 1×20 µm.

In the ON-state, the third DC voltage V3 is applied through the switch apparatus Sw to the drain terminal D2 of the second FET Q2, whereby the second FET Q2 then forms a source follower with an active load, which is realized through the third FET Q3. By the direct connection of the gate terminal G3 and the source connection S3 of the third FET Q3, the said third FET Q3 works as a current source, whereby a saturation current of, for example, some 6 mA is created. In this manner, the control signal Sc, existing at the source terminal S2 of the second FET Q2 follows the input signal Vin without a voltage offset.

In the OFF-state, the fourth DC voltage V4 is switched through the switch apparatus Sw to the drain terminal of the second FET Q2. The control signal Vc, active at the source terminal S2 assumes, in this way, a fixed negative value.

Figure 6:
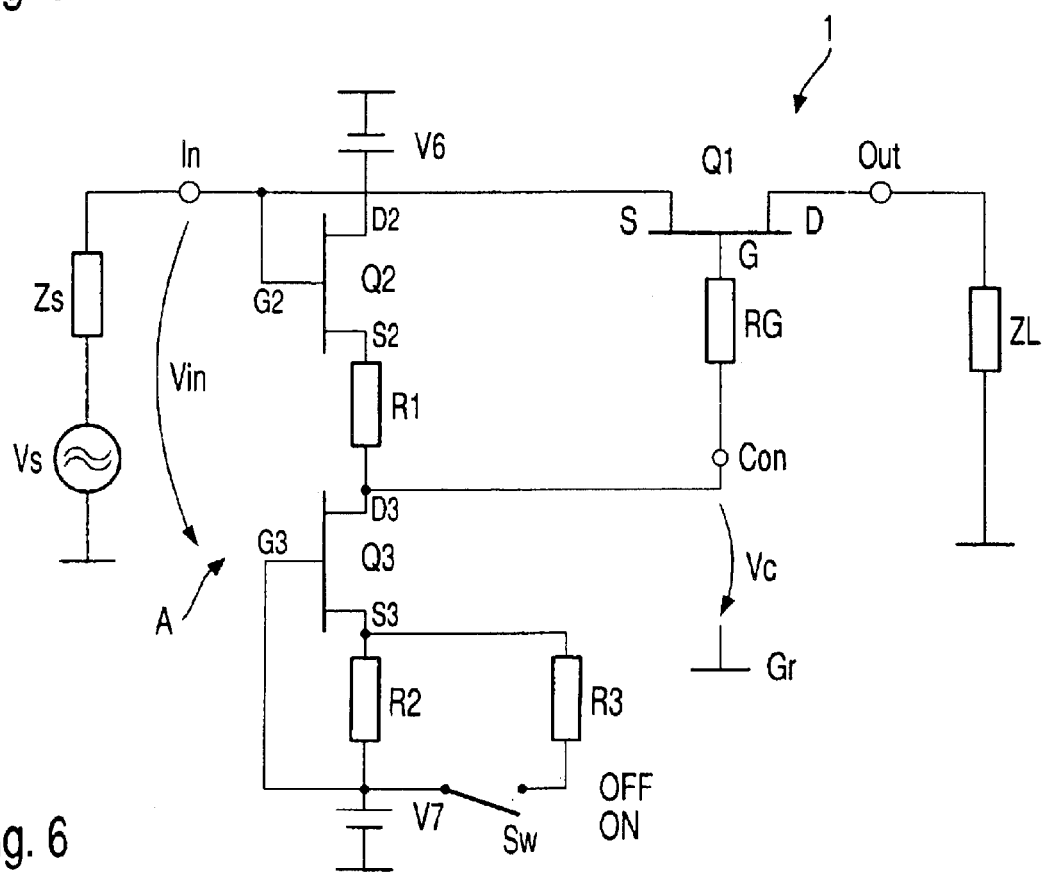

FIG. 6 shows, in a schematic circuit, a realization of the second embodiment example previously exhibited in FIG. 4. In this circuit, the control port Con is connected to the drain terminal D3 of the third FET Q3 and with the first terminal of a first resistor R1. The second terminal thereof is connected to the source terminal S2 of the second FET Q2. The drain terminal D2 of the second FET Q2 is connected to a sixth DC voltage V6, while its gate terminal is joined with the input IN and the source terminal G of the first FET Q1. A seventh DC voltage V7 is connected to the gate terminal G3 of the third FET Q3, to a first terminal of a second resistor R2 and to the switch apparatus Sw. The switch apparatus Sw is otherwise connected from a first terminal thereof to a third resistor R3. The second terminal of the third resistor R3 is, together with the second terminal of the second resistor R2, connected to the source terminal S3 of the third FET Q3.

The external circuitry at the input IN and output OUT, as well as the source, the gate, and drain terminals (respectively S, G and D) of the first FET Q1 is realized in the same way as in the foregoing examples. The second and third FETs Q2, Q3 as well as the first and second resistors, namely R1 and R2 exhibit in this embodiment, the same electrical characteristics.

In this embodiment, the sixth DC voltage V6 is positive in relation to the reference potential Gr and the seventh DC voltage V7 is negative thereto.

The third FET Q3 forms, along with the second resistor R2, a source of current with a drain current, which is smaller than the saturation current. The switch apparatus Sw, when the ON-state, is open and switches in the OFF-state to the third resistor R3, which is then in parallel to the second resistor R2.

Because of the gate terminal G3 being connected directly with the seventh DC voltage V7 of the third FET Q3, upon constant drain-source voltage of the third FET Q3, the drain current of the third FET Q3 is dependent only on the resistance value of the second resistor R2, that is, the equivalent resistance value of the parallel connected resistors R2 and R3.

In the ON-state, that is, upon an opened switch apparatus Sw, there lies at the control port Con, the replicated correction signal Sc of the input signal Vin. The control signal Vc represents in this case, the correction signal Sc. In the OFF-state, the signal at the control port Con approaches the negative seventh DC voltage V7. Again in this case, potential variations at the input IN lead to the formation of a correction signal Sc. The correction signal Sc is, thus, offset by a negative DC voltage. This negative DC voltage, advantageously, is as great as the pinch-off voltage of the first FET Q1. This embodiment of the present invention improves the low frequency large signal behavior of the electronic switch 1, both in the ON-state as well as in the OFF-state. This adapts itself especially for an integration on a semiconductor chip and for installation in electronic switches, which employ transistor types with pinch-off voltages of small absolute value. Such transistors are, for example, High Electron Mobility Transistors (HEMT), which, for instance, show pinch-off voltages of −1 volt.

Figure 7:
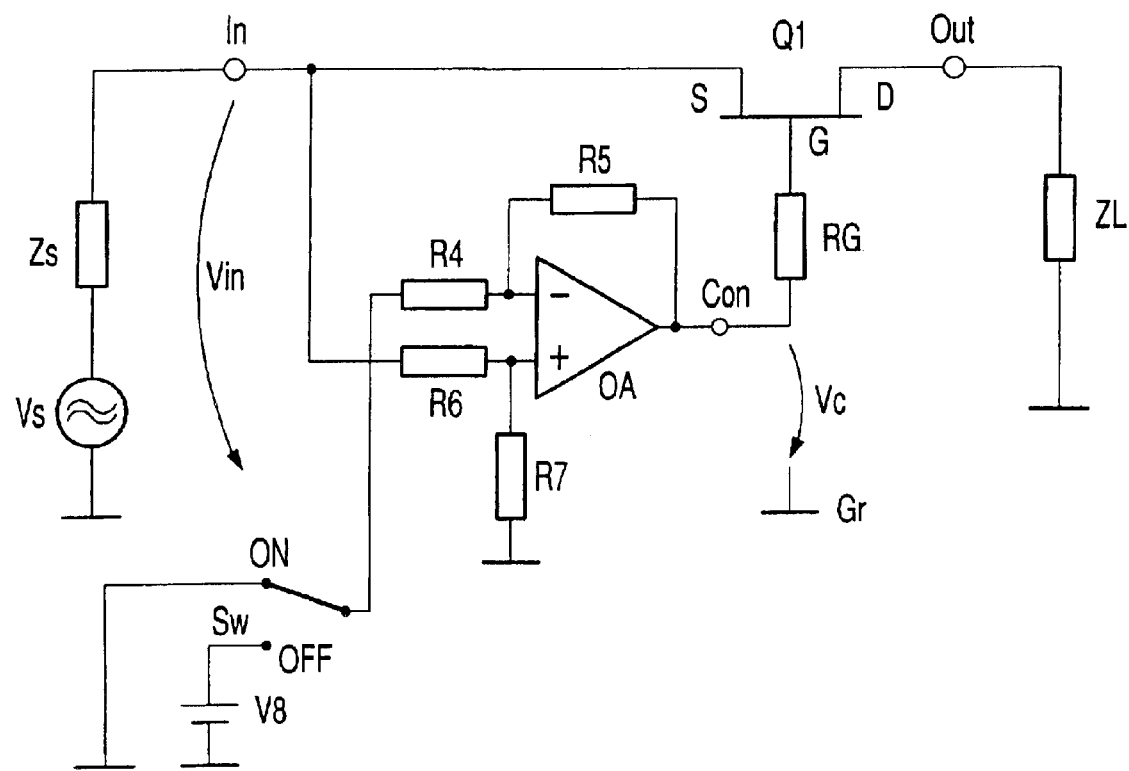

FIG. 7 shows a schematic circuit of a realization of the invented electronic switch 1 with an operational amplifier OA, the non-inverting input terminal (+) of which is connected through a sixth resistor R6 with the input IN and the inverting input terminal (−) of which is connected through a resistor R4 with the switch apparatus Sw. Following this arrangement, the switch apparatus Sw connects the fourth resistor, when in the ON-state, with the reference potential Gr, and when in the OFF-state with a, in this embodiment, positive eighth DC voltage V8. A fifth resistor R5 connects the output terminal of the operational amplifier OA, which is connected to the control port Con, with its own inverting input (−). By means of a seventh resistor R7, the non-inverting input (+) is connected with the reference potential Gr.

The external circuitry at the input IN and output OUT as well as the source, gate and drain terminals (namely S, G, and D) of the first FET Q1 is realized as in the foregoing examples. The fourth, fifth, sixth and seventh resistors, respectively, R4, R5, R6, R7 exhibit, in this embodiment, the same values of resistance, whereby in the ON-state at the control port Con, a correction signal Sc is present, which is not offset by a DC voltage. In the OFF-state, the waveform of the control signal Vc represents the waveform of the input signal Vin which is offset by the inverse of the positive eighth DC voltage V8.

Also, this embodiment improves the low frequency, large signal behavior of the electronic switch 1 both in the on-state as well as in the off-state.

What is claimed is:

1. An electronic switch adapted to assume two switching states, an ON-state and an OFF-state, said electronic switch comprising:

at least one field effect switching transistor, an input port connected to a source terminal of the at least one field effect switching transistor, wherein an input signal exists at said source terminal, an exit output port connected with a drain terminal of the at least one field effect switching transistor, wherein a switched signal exists at said drain terminal, a control port connected with a gate terminal of the at least one field effect switching transistor, wherein a control signal for controlling the electronic switch exists at said gate terminal, and a switching apparatus adapted to create the two switching states by an alteration of the control signal, wherein the control signal, during at least one of the two switching states, is at least partially produced from a correction signal formed from the input signal, so that a frequency dependent voltage drop between a drain-source channel and a gate electrode of the at least one field effect switching transistor is at least partially compensated.

2. The electronic switch of claim 1, wherein a converter having an adjustable voltage gain generates the correction signal from a waveform of the input signal.

3. The electronic switch of claim 2, wherein the adjustable voltage gain carries a value of unity.

4. The electronic switch of claim 2, wherein the converter possesses a low output impedance and a high input impedance.

5. The electronic switch of claim 2, wherein the converter comprises field effect transistors.

6. The electronic switch of claim 5, wherein the field effect transistors are n-channel type Metal Semiconductor Field Effect Transistors (MESFETs).

7. The electronic switch of claim 1, wherein the at least one field effect switching transistor is at least one member selected from the group consisting of a Metal Semiconductor Field Effect Transistor (MESFET), an n-channel type MESFET, a gallium arsenide based transistor and a High Electron Mobility Transistor (HEMT).

8. The electronic switch of claim 1, wherein the switching apparatus comprises field effect transistors.

9. The electronic switch of claim 8, wherein the field effect transistors are n-channel type Metal Semiconductor Field Effect Transistors (MESFETs).

10. The electronic switch of claim 1, wherein the switching apparatus is adapted to apply to the control port either a first DC voltage or the correction signal, such that the two switching states are attained.

11. The electronic switch of claim 10, wherein the OFF-state is established upon connecting the first DC voltage with the control port, and the ON-state is established upon connecting the control port with the correction signal.

12. The electronic switch of claim 11, wherein the first DC voltage is more negative than a pinch-off voltage of the at least one field effect switching transistor.

13. The electronic switch of claim 1, wherein the switching apparatus is adapted to connect to the control port either a first DC voltage superimposed with the correction signal or a second DC voltage superimposed with the correction signal, such that the two switching states can be achieved.

14. The electronic switch of claim 13, wherein connecting to the control port the first DC voltage superimposed with the correction signal switches the electronic switch into the OFF-state, and connecting to the control port the second DC voltage superimposed with the correction signal switches the electronic switch into the ON-state.

15. The electronic switch of claim 14, wherein the first DC voltage is more negative than a pinch-off potential of the at least one field effect switching transistor and/or the second DC voltage is about the same as a reference potential of the electronic switch.

16. The electronic switch of claim 10, wherein the control port is connected to the source terminal of a second field effect transistor and is connected to the drain terminal of a third field effect transistor, the gate terminal and the source terminal of the third field effect transistor are connected to a fifth DC voltage less than a reference potential, the gate terminal of the second field effect transistor is connected by a series resistor with the input port, and the drain terminal of the second field effect transistor is optionally connected to the reference potential by the switching apparatus, a positive third DC voltage or a negative fourth DC voltage.

17. The electronic switch of claim 16, wherein the second and the third field effect transistors exhibit identical electrical characteristic curves.

18. The electronic switch of claim 13, wherein the control port is connected to the drain terminal of a third field effect transistor and is connected to a first terminal of a first resistor, a second terminal of the first resistor is connected to the source terminal of a second field effect transistor, the drain terminal of the second field effect transistor is connected to a positive sixth DC voltage, the gate terminal of the second field effect transistor is connected to the input port, the gate terminal of the third field effect transistor is connected to a negative seventh DC voltage and to a first terminal of a second resistor and to the switching apparatus, and by way of the switching apparatus the first terminal of the second resistor is connected to a first terminal of a third resistor and the second terminal of the third resistor together with the second terminal of the second resistor is connected to the source terminal of the third field effect transistor.

19. The electronic switch of claim 18, wherein a switching together of the first terminal respectively of the second and third resistors by way of the switching apparatus creates the OFF-state.

20. The electronic switch of claim 19, wherein the second and the third field effect transistor exhibit identical electrical characteristic curves and the first and the second resistor exhibit identical electrical characteristic curves.

21. The electronic switch of claim 1, wherein all field effect transistors are normally-on transistors.

22. The electronic switch of claim 1, wherein the input port connects through a sixth resistor with a non-inverting input of an operational amplifier, the switching apparatus by way of a fourth resistor switches either to a reference potential or switches an eighth DC voltage to an inverting input terminal, in order to bring about the switching states, a fifth resistor connects the inverting input terminal with an output of the operational amplifier, an output terminal of the operational amplifier with the control port and a seventh resistor connects the non-inverting input terminal with the reference potential.

23. The electronic switch of claim 22, wherein the fourth, fifth, sixth and seventh resistors have identical resistance values.

24. The electronic switch of claim 23, wherein the ON-state is switched into by the way of the connection of the fourth resistor with the reference potential and the OFF-state is switched into by way of the connection of the fourth resistor with the eighth DC voltage.

25. The electronic switch claim 24, wherein the eighth DC voltage is positive in relation to the reference potential.

* * * * *